(12) United States Patent
Coimbra et al.

(10) Patent No.: US 11,368,126 B1
(45) Date of Patent: Jun. 21, 2022

(54) CRYSTAL OSCILLATOR CIRCUIT AND METHOD OF OPERATION

(71) Applicant: NXP B.V., Eindhoven (NL)

(72) Inventors: Ricardo Pureza Coimbra, Campinas (BR); Stefano Pietri, Austin, TX (US); Vitor Moreira Gomes, Campinas (BR); Eduardo Ribeiro da Silva, Campinas (BR)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 17/444,320

(22) Filed: Aug. 3, 2021

(51) Int. Cl.
*H03B 5/36* (2006.01)
*H02M 3/158* (2006.01)

(52) U.S. Cl.
CPC .............. *H03B 5/36* (2013.01); *H02M 3/158* (2013.01); *H03B 2200/0094* (2013.01)

(58) Field of Classification Search
CPC .. H02M 3/158; H03B 2200/0094; H03B 5/36
USPC ........................... 331/158, 116 FE, 185, 175
See application file for complete search history.

(56) References Cited

U.S. PATENT DOCUMENTS

| | | | |
|---|---|---|---|
| 9,407,200 B2 | 8/2016 | Verma et al. | |
| 10,411,649 B2 | 9/2019 | Akhavan et al. | |
| 2005/0007205 A1* | 1/2005 | Bridger | H03B 5/368 331/108 C |
| 2020/0220496 A1 | 7/2020 | Pamarti et al. | |

OTHER PUBLICATIONS

Hsiao: "A 1.89nW/0.15V Self-Charged XO for Real-Time Clock Generation", 2014 IEEE International Solid-State Circuits Conference Digest of Technical Papers (ISSCC), Feb. 9-13, 2014, DOI: 10.1109/ISSCC.2014.6757442, San Francisco, CA, USA, pp. 298-300.

* cited by examiner

*Primary Examiner* — Arnold M Kinkead

(57) ABSTRACT

A first switch is operable to couple a start-up oscillator circuit to a first crystal pin during operation in a start-up mode and decouple the start-up oscillator circuit from the first crystal pin during operation in a normal mode, and a second switch is operable to couple the start-up oscillator circuit to a second crystal pin during operation in the start-up mode and decouple the start-up oscillator circuit from the second crystal pin during operation in the normal mode. A switched oscillator circuit is coupled to the startup oscillator during operation in the startup mode, and to the first and second crystal pins during operation in the start-up and normal modes. The switched oscillator circuit includes a sample and charge circuit which is configured to sample a direct current (DC) level of the first crystal pin and precharge a first coupling capacitor during operation in the startup mode.

20 Claims, 4 Drawing Sheets

CRYSTAL OSCILLATOR CIRCUIT AND METHOD OF OPERATION

BACKGROUND

Field

This disclosure relates generally to integrated circuits, and more specifically, to a crystal oscillator circuit coupled to crystal pins of the integrated circuit.

Related Art

Crystal oscillator circuits are coupled to crystal pins, Extal and Xtal, to which an external crystal is coupled in order to maintain the oscillation amplitude at Extal and Xtal at a design-defined level. However, current oscillator circuits, which primarily operate through direct DC connections to Extal and Xtal, results in large leakage loss at the pins. Therefore, a need exists for a current oscillator circuit with reduced power consumption as compared to current solutions.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

An oscillator circuit of an integrated circuit (IC) is coupled to crystal pins, Extal and Xtal, of the IC, to which an external crystal is coupled during operation of the IC. The oscillator circuit ensures proper startup of the crystal oscillator, and during normal operation, that the oscillation amplitude across Extal and Xtal remain at a design-defined level. The oscillator circuit therefore includes a startup oscillator which is only used to start-up the oscillation. Once the oscillation amplitude has reached an appropriate level, though, the startup oscillator is turned off and disconnected from the crystal (i.e. disconnected from Extal and Xtal), and a switched oscillator takes over to ensure that the oscillation remains at the proper amplitude for normal operation. Within the switched oscillator, a sample and charge circuit is used to sample a DC level of a crystal pin and pre-charge a coupling capacitor during startup while the startup oscillator is operating, which allows for improved transition of the oscillator circuit between start-up and normal operation. Once in normal operation, the oscillator circuit can be used to generate signals such as clocks for the IC, in which the precharged coupling capacitor allows for a DC level of the oscillation by the oscillator circuit to be maintained.

Figure 1:
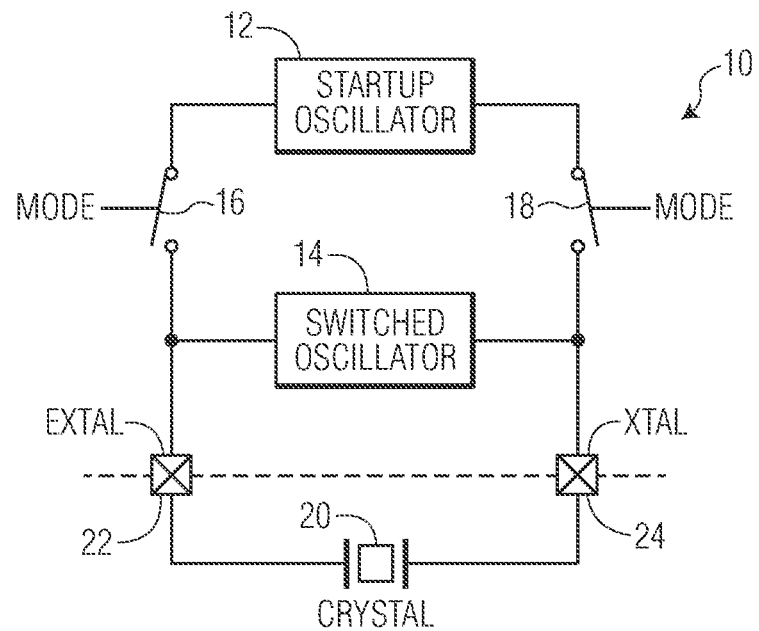
FIG. 1 illustrates, in partial schematic and partial block diagram form, an oscillator circuit including a startup oscillator and a switch oscillator, in accordance with one embodiment of the present invention.

FIG. 1 illustrates a crystal oscillator circuit 10 implemented within an IC which includes crystal pins Extal 22 and Xtal 24. An external crystal 20 is coupled to Extal 22 and Xtal 24. Oscillator circuit 10 includes a startup oscillator 12 which is coupled to Extal 22 and Xtal 24 via switches 16 and 18, respectively. A mode signal is provided to the control inputs of switches 16 and 18 such that when the mode signal indicates oscillator 12 is operating in startup mode, switches 16 and 18 are both closed such that startup oscillator 12 is connected to pins 22 and 24 (and thus to crystal 20), and when the mode signal indicates active mode (i.e. normal operation), switches 16 and 18 are both opened such that startup oscillator 12 is disconnected from pins 22 and 24 (and thus from crystal 20). Startup oscillator 12 can be implemented using a conventional crystal oscillator circuit AC and is only enabled during start-up. Switched oscillator 14 is coupled between pins 22 and 24. Crystal 20 is an external crystal in that it is external to the IC which includes oscillator circuit 10. Upon reaching steady-state operation, crystal 20 operates at a constant frequency with a nominal DC voltage and a nominal voltage swing about the nominal DC voltage.

In operation, upon powering up, startup oscillator 12 is connected to the crystal pins via closed switches 16 and 18 and is used to initiate, build-up, and stabilize the oscillating voltage amplitude at an appropriate level during start-up. Active mode (i.e. normal operation) begins with startup oscillator 12 being disabled (and disconnected from oscillator circuit 10 by way of opening switches 16 and 18 so as to unload the circuit), and switched oscillator 14 assuming control over the crystal drive. During normal operation, switched oscillator 14 stabilizes the oscillating voltage amplitude at its final level and ultimately dictates the steady-state power consumption of the system (e.g. of oscillator circuit 10). Operation of switched oscillator 14 will be described further in reference to FIGS. 2-6.

Figure 2:
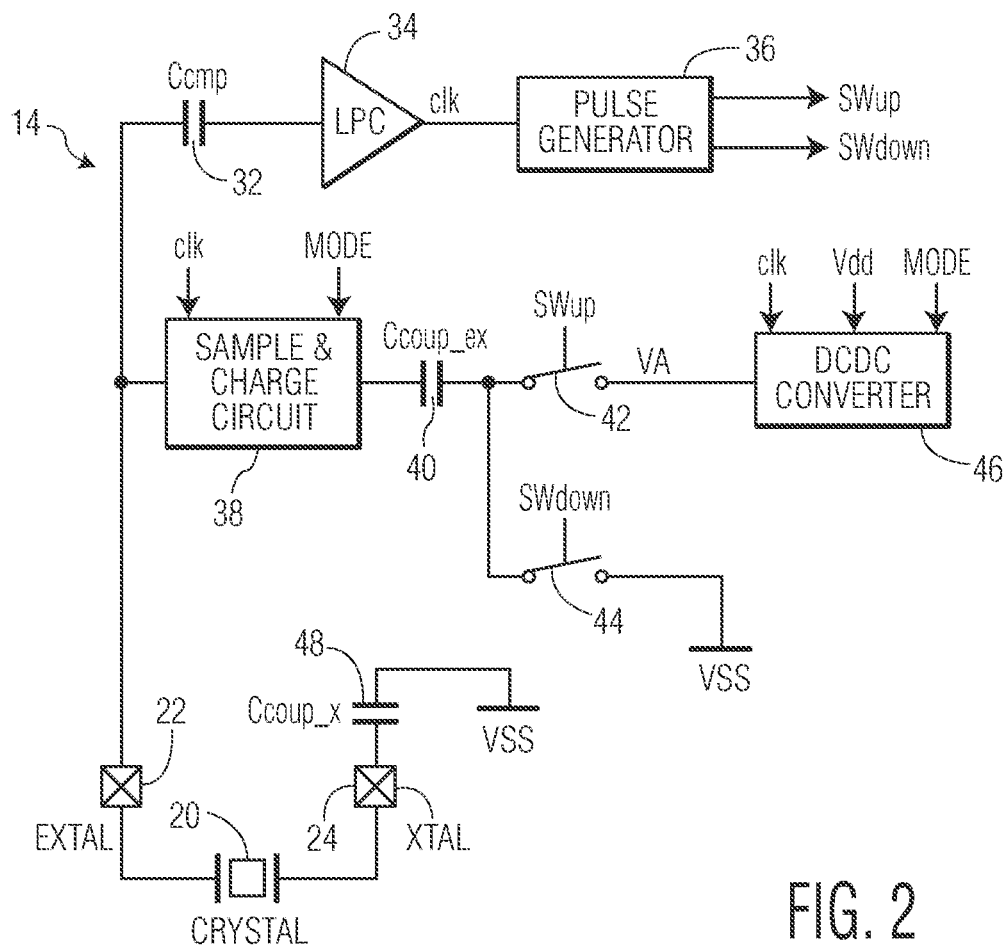
FIG. 2 illustrates, in partial schematic and partial block diagram form, a more detailed view of the switched oscillator of FIG. 1, in accordance with one embodiment of the present invention.

FIG. 2 illustrates, in partial block diagram and partial schematic form, a more detailed view of switched capacitor 14, in accordance with one embodiment of the present invention. Switched oscillator 14 includes coupling capacitors Ccmp 32, Ccoup_ex 40, and Ccoup_x 48, a low power comparator (LPC) 34, a pulse generator 36, a sample and charge (SnC) circuit 38, a DC-DC (DCDC) converter 46, and switches 42 and 44. Ccmp 32 is coupled between Extal 22 and an input to LPC 34. An output of LPC 34 provides a clock signal (clk) to pulse generator 36 in which clk is a square wave generated by LPC 34 based on the near-sinusoidal signal provided by crystal 20 at Extal 22 via Ccmp 32. Pulse generator 36 provides a first pulse, SWup, at a first output and a second pulse, SWdown, at a second output. In one embodiment, SWup is provided at about the mid-point of the high portion of each cycle of clk (i.e. at or near phase 90°) while SWdown is provided at about the mid-point of the low portion of each cycle of clk (i.e. at or near phase 270°).

Still referring to FIG. 2, SnC circuit 38 has a first terminal coupled to Extal 22 and second terminal coupled to a first terminal of Ccoup_ex 40. SnC 38 also receives clk and the mode signal (indicating startup mode vs normal mode) as control inputs. A second terminal of Ccoup_ex 40 is coupled to first data terminals of switches 42 and 44. A second terminal of switch 42 is coupled to DCDC converter 46. DCDC converter 46 receives control signals clk and mode, and is coupled to a first voltage supply terminal. A second terminal of switch 44 is coupled to a second voltage supply terminal. The first voltage supply terminal is configured to provide a first supply voltage, Vdd, and the second voltage supply terminal is configured to provide a second supply voltage, Vss, in which Vdd is greater than Vss. Note that for ease of explanation, each of the first and second voltage supply terminals may simply be referred to as Vdd and Vss, respectively. DCDC converter 46 provides a voltage VA generated from Vdd, in which VA is less than Vdd. In one embodiment, DCDC converter is referred to as a step-down converter which down converts Vdd to VA, in which VA is set to one value during start-up mode and a second value during active mode (normal operation). In one embodiment, it is implemented as a switched-capacitor step-down converter, as known in the art. A control input of switch 42 is coupled to receive SWup, and a control input of switch 44 is coupled to receive SWdown. A first terminal of Ccoup_x 48 is coupled to Xtal 24 and a second terminal of Ccoup_x 48 is coupled to Vss.

In operation, during start-up mode while startup oscillator 12, rather than switched oscillator 14, is controlling oscillation, SnC circuit 38 precharges Ccoup_ex 40 to a voltage $V_{SHIFT}$ which corresponds to the voltage difference between the mid-voltage level at Extal 22 (VDC) and the amplitude of the signal which will be maintained during normal operation at Extal 22 (Vamp). Upon a transition to normal operation, the stored voltage on Ccoup_ex allows a seamless transition in which the VDC is maintained from the end of startup-up mode through to active mode.

Figure 3:
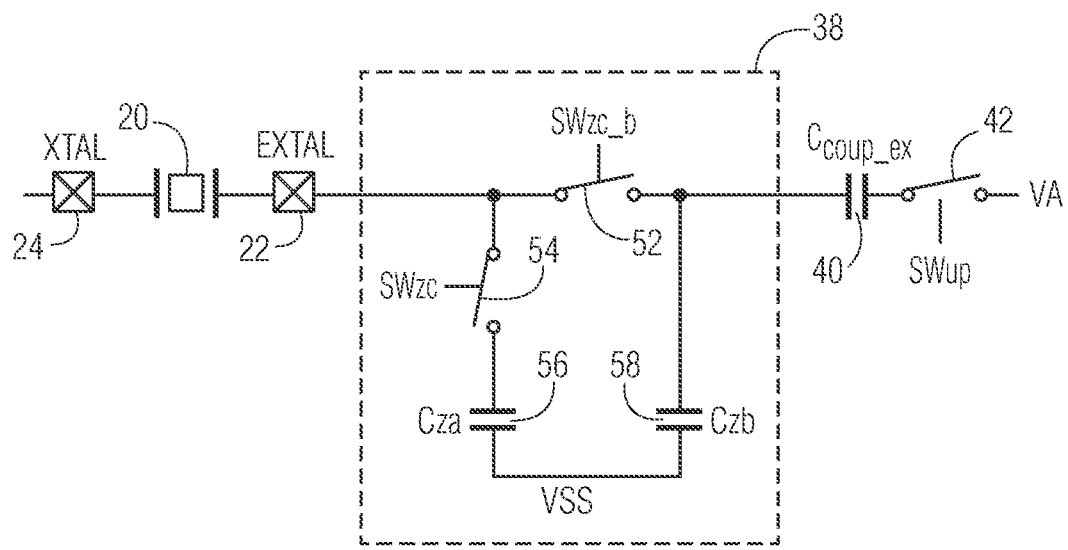
FIG. 3 illustrates, in schematic form, a sample and charge circuit of the switched oscillator of FIG. 2, in accordance with one embodiment of the present invention.

FIG. 3 illustrates a more detail view of SnC circuit 38, which is coupled between Extal 22 and Ccoup_ex 40, in accordance with one embodiment of the present invention. SnC circuit 38 includes switches 54 and 52, and capacitors Cza 56 and Czb 58. Switch 54 has a first data terminal coupled to Extal 22, a second data terminal coupled to a first terminal of Cza 56, and a control input coupled to receive digital control signal SWzc. Switch 52 has a first data terminal coupled to Extal 22, a second data terminal coupled to the first terminal of Ccoup_ex 40, and a control input coupled to receive digital control signal SWzc_b (which is the inverse of SWzc). The second data terminal of switch 52 is also coupled to a first terminal of Czb 58. Second terminals of Cza 56 and Czb 58 are coupled to VSS. Xtal 24, crystal 20, Extal 22, Ccoup_Ex 40, and switch 42 are also illustrated in FIG. 3 for ease of the explanation of FIG. 3. Operation of FIG. 3 will also be described in reference to the timing diagram of FIG. 4.

Figure 4:
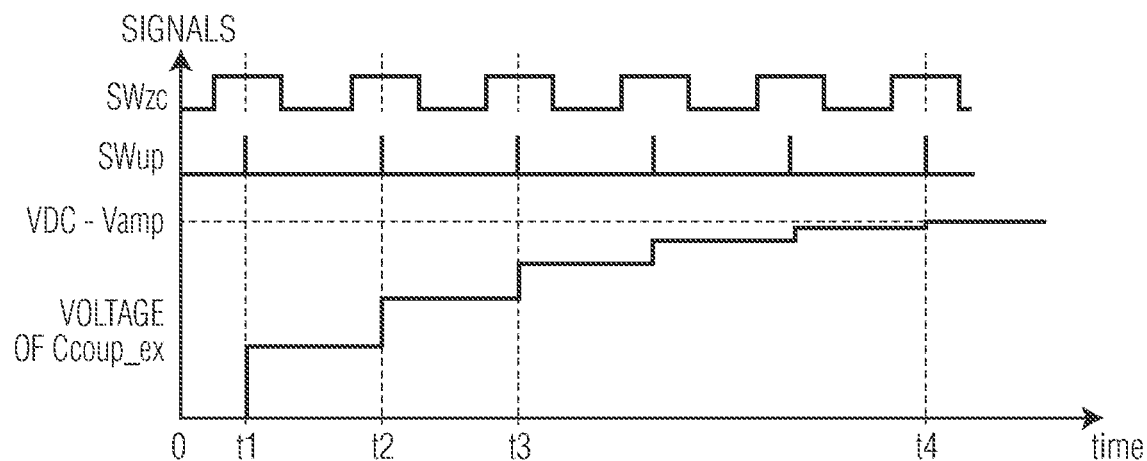
FIG. 4 illustrates a timing diagram for various signals during startup operation of the oscillator circuit of FIG. 1.

In operation, SnC circuit 38 is only active for a pre-charge mode which occurs during the start-up mode. For this pre-charge mode, SnC circuit 38 samples the mid-voltage level at Extal 22 (VDC) and charges the terminal voltage of Ccoup_ex 40 to that level over the course of numerous cycles. FIG. 4 illustrates the values of SWzc, Swup, and the voltage stored on Ccoup_ex 40 during the pre-charge mode during start-up. During this mode, SWzc is the same as clk (output by LPC 34), and the pulses SWup are generated by pulse generator 36 such that it occurs during the high portion of each cycle of SWzc (corresponding to clk, as described above in reference to FIG. 2). With each pulse of SWup, occurring at times t1-t4 in the example of FIG. 4, the charge on Ccoup_ex increased until it reaches VDC-Vamp.

Referring to FIG. 3, at each clock period of SWzc during start-up, Czb 58 samples VDC at the rising edge of SWzc because at the rising edge, SWzc is one and SWzc_b is zero. This closes switch 54, and opens switch 52. When SWup is pulsed, switch 42 briefly closes (for the duration of the SWup pulse), applying VA to the second terminal of Ccoup_ex 40 such that charge is transferred from Czb 58 to Ccoup_ex 40. Note that Cza=Czb, and is much smaller than Ccoup_ex. During start-up, DCDC converter 46 provides VA as the target amplitude, Vamp, of crystal 20 at Extal 22. This target amplitude is one time (1×) the amplitude of the oscillation that will be controlled by switched oscillator 14. Therefore, when switch 42 is closed, the second terminal of Ccoup_ex 40 is forced to VA such that Czb pumps charge into Ccoup_ex. At the falling edge of $SW_{ZC}$, $SW_{ZC}$ is zero and SWzc_b is one, thus opening switch 54 and closing switch 52. This couples the first terminal of Ccoup_ex 40 to Extal 22, bypassing capacitors 56 and 58. In this manner, an SnC circuit is a circuit which can sample and hold a voltage from a circuit node (e.g. Extal 22) in a sampling phase (e.g. when SWzc is high, during which the pulse of SWup occurs), and connect a capacitive load (e.g. Ccoup_ex 40) to the circuit node during a bypass phase (e.g. when SWzc_b is low). The sampling and bypass phases of SnC circuit 38 continue, increasing charge with each pulse of SWup, until Ccoup_ex 40 ends up holding the difference between VDC (at Extal 22) and the target amplitude Vamp. By the end of the start-up mode, Ccoup_ex stores $V_{SHIFT}$, in which $V_{SHIFT}$=VDC-Vamp.

Note that during the precharging, regardless of the value of SWzc, one of Cza or Czb is always connected to Extal 22, in which Cza=Czb. In this manner, the capacitance load on Extal 22 is maintained unaltered during start-up as Ccoup_ex is precharged. This may result in minimized distortion on Extal 22. Once start-up mode ends, the transition to active mode is seamless due to the precharged voltage on Ccoup_ex 40. Upon transitioning to active mode, SWzc is held low such that switch 52 remains closed and switch 54 remains open. In this manner, during normal operation, Extal 22 is directly connected to the first terminal of Ccoup_ex 40 such that the oscillation at Extal 22 is DC shifted by $V_{SHIFT}$.

Figure 5:
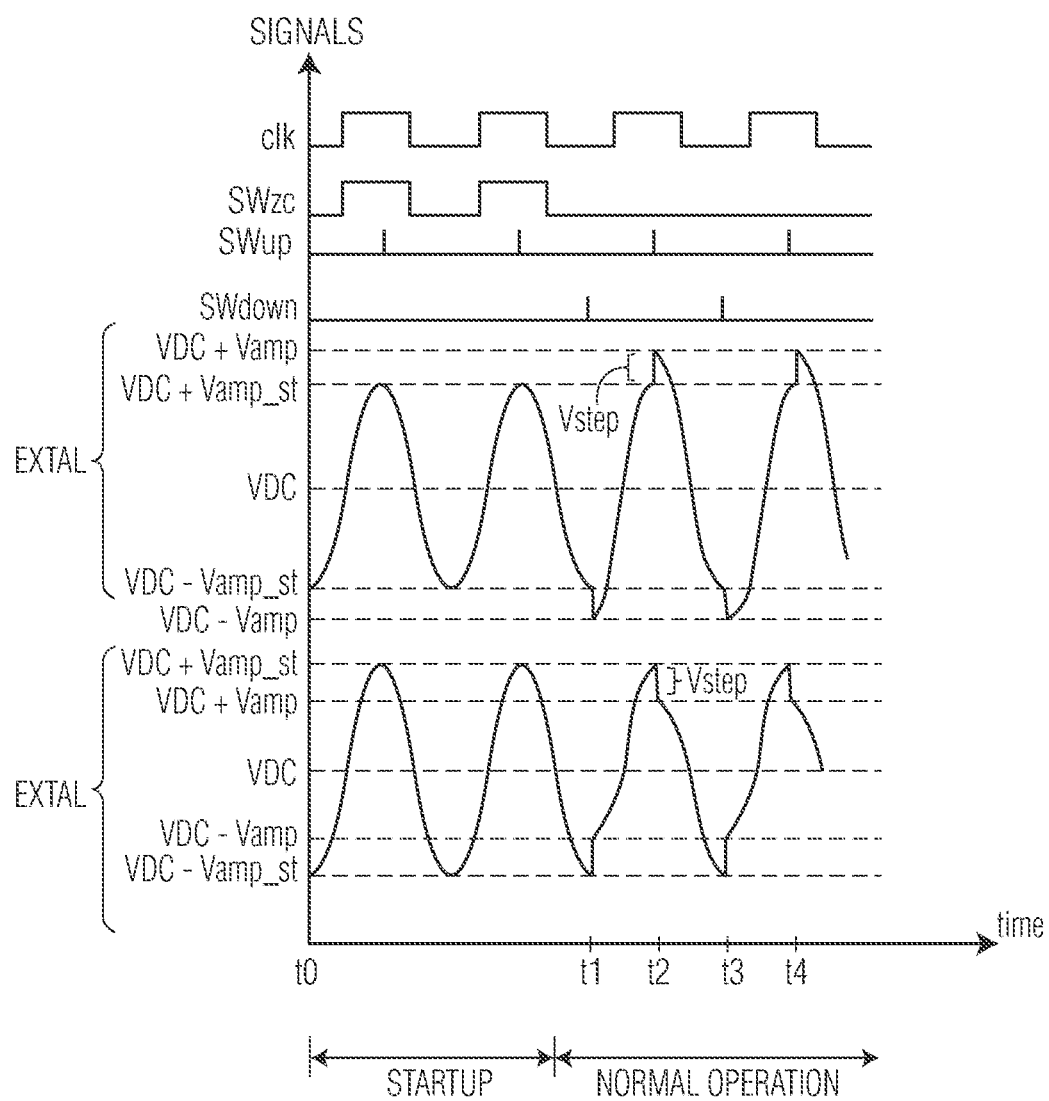
FIG. 5 illustrates a timing diagram for various signals during startup operation and normal operation of the oscillator circuit of FIG. 1, in accordance with one embodiment of the present invention.

Operation of switched capacitor 14 will be further described in reference to the timing diagram of FIG. 5, which includes waveforms for clk, SWzc, SWup, SWdown, a top example of Extal using a first value for Vamp_st, and a bottom example of Extal using a second value for Vamp_st, in which Vamp_st refers to the amplitude of oscillation at the end of the startup mode. In FIG. 5, at time t0, switched capacitor 14 is in start-up mode (i.e. during a start-up period of operation) during which the oscillation at Extal 22 is controlled by startup oscillator 12. Therefore, the voltage at Extal oscillates around the mid-level VDC, between VDC+Vamp_st and VDC−Vamp_st. Also, as described above, SWzc follows clk (is the same as clk), and the SWup pulses are provided by pulse generator 36. In the illustrated embodiment, during start-up mode, SWdown is set to low. During the start-up mode, Ccoup_ex 40 is being charged to VDC-Vamp as controlled by SWzc and SWup. Note that in alternate embodiments, the precharging of Ccoup_ex can be performed using SWdown pulses rather than the SWup pulses to control switch 42.

After time t0 but prior to time t1, switched capacitor 14 transitions from startup mode to active mode (i.e. normal operation or normal active period of operation), in which startup oscillator 12 is decoupled from the circuit via switches 16 and 18, and the oscillation of crystal 20 is controlled by switched oscillator 14. In FIG. 5, times t1-t4 all occur during normal operation. In the waveforms of FIG. 5, Vamp_st refers to the amplitude of oscillation at the end of startup while Vamp refers to the target amplitude of oscillation during normal operation. (Note that Vamp_st of startup mode may or may not be equal to the Vamp of normal operation.) Upon transitioning to normal operation, SWzc is set to low, such that Extal 22 is directly connected to Ccoup_ex 40 via closed switch 52, and pulse generator 36 generates both pulses SWup and SWdown, as described above. During normal operation, DCDC converter 46 provides the value of VA at its output as the target peak-to-peak (pk2pk) voltage during normal operation, in which the target pk2pk voltage is two times the target amplitude (2×Vamp) during normal operation. Therefore, DCDC converter 46 provides the value of VA as the target amplitude during startup (1×Vamp) and provides the value of VA as the target pk2pk during normal operation (2×Vamp).

During normal operation, for very short durations (during the SWup pulse or SWdown pulse), VA or Vss is forced onto the second terminal of Ccoup_ex 40. As discussed above, SWup is timed so that it occurs at about the top peak of oscillation of Extal, and SWdown is timed so that it occurs at about the bottom peak of oscillation of Extal, in order to achieve the target pk2pk oscillation. In FIG. 5, the top example of Extal corresponds to the case in which the amplitude at the end of start-up mode is less than the target amplitude during normal operation (i.e. Vamp_st<Vamp), while the bottom example of Extal corresponds to the case in which the target amplitude at the end of start-up mode is greater than the target amplitude during normal operation (i.e. Vamp_st>Vamp).

Referring first to the top example in which Vamp_st<Vamp, at each of times t2 and t4, an SWup pulse occurs, during which "2×Vamp" (provided by DCDC converter 46) is connected to the second terminal of Ccoup_ex 40. In this case, due to the precharged voltage stored on Ccoup_ex 40, the pulses of "2×Vamp" applied to the second terminal of Ccoup_ex are DC shifted by $V_{SHIFT}$ such that the top peak of oscillation hits "VDC+Vamp" and VDC is maintained. Similarly, at each of times t1 and t3, an SWdown pulse occurs, during which Vss is connected to the second terminal of Ccoup_ex 40. Due to the precharged voltage stored on Ccoup_ex 40, Vss is also DC shifted by $V_{SHIFT}$ such that the low peak hits "VDC-Vamp" and VDC is maintained. Therefore, at each high or low peak of the oscillation of Extal during normal operation, "2×Vamp" or Vss is used, respectively, to increase the Vamp_st from start-up (by, e.g., Vstep) to achieve the desired peak levels while maintaining a constant VDC. The same description applies to the bottom example of Extal, but since Vamp_st>Vamp, at each high or low peak of the oscillation of Extal during normal operation, "2×Vamp" or Vss is used, respectively, to decrease the Vamp_st from start-up (by, e.g., Vstep) to achieve the desired peak levels while maintaining a constant VDC.

During normal operation, such as beyond time t4, the magnitude of Vstep ultimately stabilizes such that the power delivered to crystal 20 compensates for its losses at each cycle. Note that Vstep is much smaller than the target amplitude Vamp, and therefore, the oscillation amplitude does become approximately Vamp.

Figure 6:
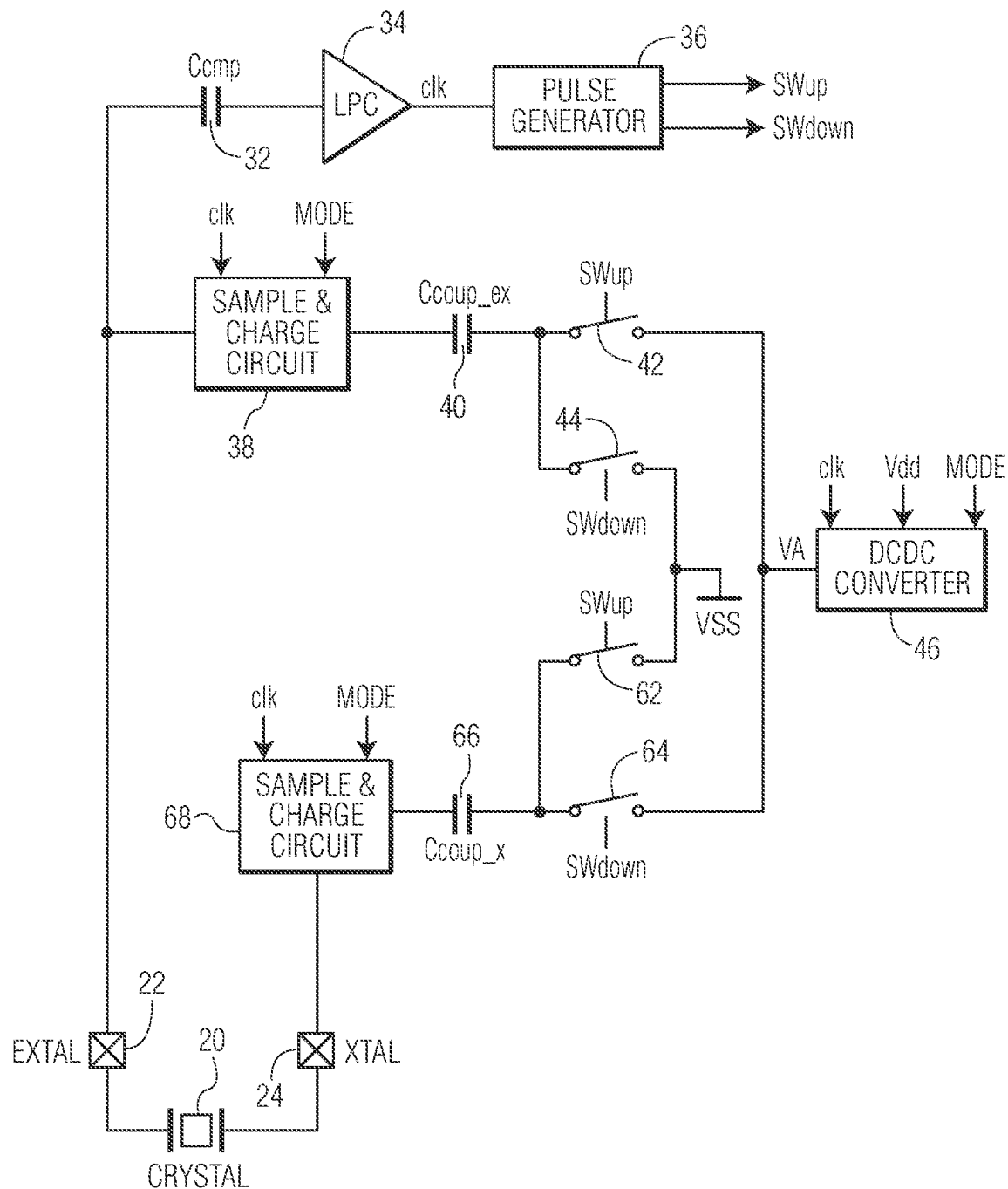
FIG. 6 illustrates, in partial schematic and partial block diagram form, a more detailed view of the switched oscillator of FIG. 1, in accordance with another embodiment of the present invention.

Note that while the descriptions of FIGS. 2-5 where all done with respect to controlling oscillation at Extal 22, the same could be done on Xtal 24 instead. In yet another embodiment, power can be delivered to both crystal pins (Extal 22 and Xtal 24) in a similar manner. In this embodiment, the descriptions provided above with respect to FIGS. 2-5 and Extal 22 can also be applied for Xtal 24 using an SnC circuit for Extal 24 similar to SnC circuit 38 and appropriately synchronized with each other. FIG. 6 illustrates such an embodiment.

FIG. 6 illustrates switched oscillator 14 in an embodiment which further includes an SnC circuit 68, which also receives clk and mode, coupled between Xtal 24 and a second coupling capacitor Ccoup_x 66 (instead of Ccoup_x 48 of FIG. 2). Switched capacitor circuit 14 also includes additional switches 62 and 64. A first terminal of SnC circuit 68 is coupled to Xtal 24, and a first terminal of SnC circuit 68 is coupled to a first terminal of Ccoup_x 66. A second terminal of Ccoup_x 66 is coupled to first data terminals of switches 62 and 62. A second data terminal of switch 62 is coupled to VSS and a second data terminal of switch 64 is coupled to receive VA from DCDC converter 46. A control input of switch 62 is coupled to receive SWup, and a control input of switch 64 is coupled to receive SWdown.

With respect to the embodiment of FIG. 6, SnC circuit 68 operates analogously to SnC circuit 38, but precharges Ccoup_x 66 during start-up mode. Therefore, SnC 68 can be implemented similar to SnC circuit 38, but in which VA is connected to Ccoup_x 66 during the SWdown pulses. In this manner, Ccoup_x 66 is precharged with each pulse of SWdown while Ccoup_ex 40 is precharged with each pulse of SWup. By having two capacitors in SnC circuit 68, similar to Cza and Czb of SnC circuit 38, the capacitance load on Xtal 24 is also constantly maintained, which may further minimize distortion.

Therefore, by now it can be appreciated how a sample and charge circuit may be used to sample a DC level of a crystal pin and pre-charge a coupling capacitor during startup while a startup oscillator is in operation. This may allow for an improved transition of the oscillator circuit between start-up mode and active mode (i.e. normal operation). Once in normal operation, the pre-charged coupling capacitor allows for the DC level of the crystal pin to remain unaltered, even as the DC level of the crystal changes over time due to leakage effects at the crystal pins. Furthermore, during start-up mode as well as in active mode, the oscillation is monitored and controlled through AC links (with no DC connections to the crystal pins), which may help ensure low power operation as compared to using DC links/connections to the crystal pins.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Also for example, in one embodiment, the illustrated elements of system 10 (which excludes crystal 20) are circuitry located on a single integrated circuit or within a same device. Also, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, separate DCDC converters may be used to generate VA during startup mode versus during active mode. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes a start-up oscillator circuit; a first switch operable to couple the start-up oscillator circuit to a first crystal pin during operation in a start-up mode and decouple the start-up oscillator circuit from the first crystal pin during operation in a normal mode, wherein the first crystal pin is couplable to a crystal; a second switch operable to couple the start-up oscillator circuit to a second crystal pin during operation in the start-up mode and decouple the start-up oscillator circuit from the second crystal pin during operation in the normal mode, wherein the second crystal pin is couplable to the crystal; and a switched oscillator circuit coupled to the startup oscillator during operation in the startup mode, and to the first and second crystal pins during operation in the start-up and normal modes. In this embodiment, the switched oscillator circuit includes: a sample and charge circuit including an input terminal coupled to the first crystal pin and an output terminal; and a first coupling capacitor including a first terminal and a second terminal, the first terminal coupled to the output terminal of the sample and charge circuit, wherein the sample and charge circuit is configured to sample a direct current (DC) level of the first crystal pin and pre-charge the first coupling capacitor during operation in the startup mode. In one aspect of this embodiment, the switched oscillator circuit further includes a third switch including a first terminal, a second terminal, and a control terminal coupled to a first control signal, the first terminal of the third switch coupled to the second terminal of the first coupling capacitor; and a DCDC converter including a first input coupled to the second terminal of the third switch, a second input coupled to a first supply voltage, and a third input coupled to a mode indicator. In a further aspect, the switched oscillator circuit further includes a fourth switch including a first terminal coupled to the second terminal of the first coupling capacitor, a second terminal coupled to a second supply voltage and a control terminal coupled to a second control signal. In another aspect, the switched oscillator circuit further includes a second coupling capacitor including a first terminal coupled to the second crystal pin and a second terminal coupled to a second supply voltage. In another aspect, the switched oscillator circuit further includes a comparator capacitor including a first terminal coupled to the first crystal pin and a second terminal. In a further aspect, the switched oscillator circuit further includes a low power comparator including an input terminal coupled to the second terminal of the comparator capacitor, and an output terminal on which a clock signal is provided. In yet a further aspect, the switched oscillator circuit further includes a pulse generator circuit including an input terminal coupled to the output terminal of the low power comparator, a first output terminal on which the first control signal is provided, and a second output terminal on which the second control signal is provided. In another aspect, the sample and charge circuit includes a fifth switch including a first terminal coupled to the first crystal pin and a second terminal; a first capacitor including a first terminal coupled to the second terminal of the fifth switch and a second terminal coupled to a second supply voltage; a sixth switch including a first terminal coupled to the first crystal pin and a second terminal coupled to the first coupling capacitor; and a second capacitor including a first terminal coupled to the second terminal of the sixth switch and a second terminal coupled to the second supply voltage. In another aspect, the switched oscillator circuit further includes a second sample and charge circuit including an input terminal coupled to the second crystal pin and an output terminal; and a second coupling capacitor including a first terminal and a second terminal, the first terminal coupled to the output terminal of the second sample and charge circuit, wherein the second sample and charge circuit is configured to sample a direct current (DC) level of the second crystal pin and pre-charge the second coupling capacitor during operation in the startup mode. In a further aspect, the switched oscillator circuit further includes a seventh switch including a first terminal coupled to the second terminal of the second coupling capacitor, a second terminal coupled to the second supply voltage, and a control terminal coupled to the first control signal; and an eighth switch including a first terminal coupled to the second terminal of the second coupling capacitor, a second terminal coupled to the first input of the DCDC converter, and a control terminal coupled to the second control signal.

In another embodiment, an integrated circuit includes a switched oscillator circuit including: a sample and charge circuit including an input terminal coupled to a first crystal pin and an output terminal, wherein the first crystal pin is coupled to a resonator element; a first coupling capacitor including a first terminal and a second terminal, the first terminal coupled to the output terminal of the sample and charge circuit; a first switch including a first terminal coupled to the second terminal of the first coupling capacitor, a second terminal, and a control terminal coupled to a first control signal; a second switch including a first terminal coupled to the output terminal of the sample and charge circuit and a second terminal coupled to a supply voltage; a DCDC converter including a first input coupled to the second terminal of the first switch; a comparator capacitor including a first terminal coupled to the first terminal of the sample and charge circuit and the first crystal pin, and a second terminal; a comparator including an input coupled to the second terminal of the comparator capacitor, and an output that provides a clock signal. In one aspect, the sample and charge circuit further includes a third switch including a first terminal coupled to the first crystal pin and a second terminal; a first capacitor including a first terminal coupled to the second terminal of the third switch and a second terminal coupled to the supply voltage; a fourth switch including a first terminal coupled to the first crystal pin and a second terminal coupled to the first coupling capacitor; and a second capacitor including a first terminal coupled to the second terminal of the fourth switch and a second terminal coupled to the supply voltage. In another aspect, the integrated circuit further includes a pulse generator circuit including an input terminal coupled to the output terminal of the comparator, a first output terminal on which a first control signal is provided, and a second output terminal on which a second control signal is provided. In another aspect, the integrated circuit further includes a second sample and charge circuit including an input terminal coupled to a second crystal pin and an output terminal; and a second coupling capacitor including a first terminal and a second terminal, the first terminal coupled to the output terminal of the second sample and charge circuit. In a further aspect, the integrated circuit further includes a fifth switch including a first terminal coupled to the second terminal of the second coupling capacitor, a second terminal coupled to the second supply voltage, and a control terminal coupled to the first control signal; and a sixth switch including a first terminal coupled to the second terminal of the second coupling capacitor, a second terminal coupled to the first input of the DCDC converter, and a control terminal coupled to the second control signal. In another aspect, the integrated circuit further includes an eighth switch including a first terminal coupled to the first crystal pin, a second terminal, and a control terminal coupled to an operating mode signal; a ninth switch including a first terminal coupled to a second crystal pin, a second terminal, and a control terminal coupled to the operating mode signal; and a start-up oscillator circuit including a first input terminal coupled to the second terminal of the eighth switch and a second input terminal coupled to the second terminal of the ninth switch. In another aspect, when the operating mode signal indicates a start-up mode, the start-up oscillator circuit is used to provide a start-up clock signal; and when the operating mode signal indicates a normal active mode, the switched oscillator circuit is used to provide the clock signal.

In yet another embodiment, a method of operating an oscillator circuit includes, during a start-up period of operation: operating a start-up oscillator circuit; operating a first switch to provide a first voltage value from a DCDC converter to a coupling capacitor in a switched oscillator circuit, wherein the first switch is pulsed closed periodically and then opened; and during a normal active period of operation: discontinuing operation of the start-up oscillator; continuing to operate the first switch to provide a second voltage value from the DCDC converter to the coupling capacitor by pulsing the first switch closed periodically and then opening the first switch; operating a second switch to provide a first supply voltage to the coupling capacitor, wherein the second switch is pulsed closed at different times than the first switch; and during the start-up and the normal active periods, providing output of the coupling capacitor to a sample and charge circuit. In one aspect, the method further includes charging a comparator capacitor with output from the sample and charge circuit and a voltage from a resonator; providing output from the comparator capacitor to a low power comparator; outputting a periodic signal from the comparator; and providing the periodic signal to a pulse generator to generate control signals to operate the first and second switches. In a further aspect, the method further includes charging a second coupling capacitor with voltage from the resonator, wherein the second capacitor is coupled between the resonator and the first supply voltage.

The invention claimed is:
1. An integrated circuit comprising:
   a start-up oscillator circuit;
   a first switch operable to couple the start-up oscillator circuit to a first crystal pin during operation in a start-up mode and decouple the start-up oscillator circuit from the first crystal pin during operation in a normal mode, wherein the first crystal pin is couplable to a crystal;
   a second switch operable to couple the start-up oscillator circuit to a second crystal pin during operation in the start-up mode and decouple the start-up oscillator circuit from the second crystal pin during operation in the normal mode, wherein the second crystal pin is couplable to the crystal;
   a switched oscillator circuit coupled to the startup oscillator during operation in the startup mode, and to the first and second crystal pins during operation in the start-up and normal modes, wherein the switched oscillator circuit includes:
      a sample and charge circuit including an input terminal coupled to the first crystal pin and an output terminal;
      a first coupling capacitor including a first terminal and a second terminal, the first terminal coupled to the output terminal of the sample and charge circuit, wherein the sample and charge circuit is configured to sample a direct current (DC) level of the first crystal pin and pre-charge the first coupling capacitor during operation in the startup mode.

2. The integrated circuit of claim 1, the switched oscillator circuit further comprising:
a third switch including a first terminal, a second terminal, and a control terminal coupled to a first control signal, the first terminal of the third switch coupled to the second terminal of the first coupling capacitor;
a DC-DC converter including a first input coupled to the second terminal of the third switch, a second input coupled to a first supply voltage, and a third input coupled to a mode indicator.

3. The integrated circuit of claim 2, the switched oscillator circuit further comprising:
a fourth switch including a first terminal coupled to the second terminal of the first coupling capacitor, a second terminal coupled to a second supply voltage and a control terminal coupled to a second control signal.

4. The integrated circuit of claim 1, the switched oscillator circuit further comprising:
a second coupling capacitor including a first terminal coupled to the second crystal pin and a second terminal coupled to a second supply voltage.

5. The integrated circuit of claim 3, the switched oscillator circuit further comprising:
a comparator capacitor including a first terminal coupled to the first crystal pin and a second terminal.

6. The integrated circuit of claim 5, the switched oscillator circuit further comprising:
a low power comparator including an input terminal coupled to the second terminal of the comparator capacitor, and an output terminal on which a clock signal is provided.

7. The integrated circuit of claim 6, the switched oscillator circuit further comprising:
a pulse generator circuit including an input terminal coupled to the output terminal of the low power comparator, a first output terminal on which the first control signal is provided, and a second output terminal on which the second control signal is provided.

8. The integrated circuit of claim 1, the sample and charge circuit comprising:
a third switch including a first terminal coupled to the first crystal pin and a second terminal;
a first capacitor including a first terminal coupled to the second terminal of the third switch and a second terminal coupled to a second supply voltage;
a fourth switch including a first terminal coupled to the first crystal pin and a second terminal coupled to the first coupling capacitor; and
a second capacitor including a first terminal coupled to the second terminal of the fourth switch and a second terminal coupled to the second supply voltage.

9. The integrated circuit of claim 3, the switched oscillator circuit further comprising:
a second sample and charge circuit including an input terminal coupled to the second crystal pin and an output terminal;
a second coupling capacitor including a first terminal and a second terminal, the first terminal coupled to the output terminal of the second sample and charge circuit, wherein the second sample and charge circuit is configured to sample a direct current (DC) level of the second crystal pin and pre-charge the second coupling capacitor during operation in the startup mode.

10. The integrated circuit of claim 9, the switched oscillator circuit further comprising:

a fifth switch including a first terminal coupled to the second terminal of the second coupling capacitor, a second terminal coupled to the second supply voltage, and a control terminal coupled to the first control signal;
an sixth switch including a first terminal coupled to the second terminal of the second coupling capacitor, a second terminal coupled to the first input of the DC-DC converter, and a control terminal coupled to the second control signal.

11. An integrated circuit comprising:
a switched oscillator circuit including:
a sample and charge circuit including an input terminal coupled to a first crystal pin and an output terminal, wherein the first crystal pin is coupled to a resonator element;
a first coupling capacitor including a first terminal and a second terminal, the first terminal coupled to the output terminal of the sample and charge circuit;
a first switch including a first terminal coupled to the second terminal of the first coupling capacitor, a second terminal, and a control terminal coupled to a first control signal;
a second switch including a first terminal coupled to the output terminal of the sample and charge circuit and a second terminal coupled to a supply voltage;
a DC-DC converter including a first input coupled to the second terminal of the first switch;
a comparator capacitor including a first terminal coupled to the first terminal of the sample and charge circuit and the first crystal pin, and a second terminal;
a comparator including an input coupled to the second terminal of the comparator capacitor, and an output that provides a clock signal.

12. The integrated circuit of claim 11, the sample and charge circuit further comprising:
a third switch including a first terminal coupled to the first crystal pin and a second terminal;
a first capacitor including a first terminal coupled to the second terminal of the third switch and a second terminal coupled to the supply voltage;
a fourth switch including a first terminal coupled to the first crystal pin and a second terminal coupled to the first coupling capacitor; and
a second capacitor including a first terminal coupled to the second terminal of the fourth switch and a second terminal coupled to the supply voltage.

13. The integrated circuit of claim 11 further comprising:
a pulse generator circuit including an input terminal coupled to the output terminal of the comparator, a first output terminal on which a first control signal is provided, and a second output terminal on which a second control signal is provided.

14. The integrated circuit of claim 12, further comprising:
a second sample and charge circuit including an input terminal coupled to a second crystal pin and an output terminal; and
a second coupling capacitor including a first terminal and a second terminal, the first terminal coupled to the output terminal of the second sample and charge circuit.

15. The integrated circuit of claim 14, further comprising:
a fifth switch including a first terminal coupled to the second terminal of the second coupling capacitor, a second terminal coupled to the second supply voltage, and a control terminal coupled to the first control signal; and a sixth switch including a first terminal coupled to the second terminal of the second coupling capacitor, a second terminal coupled to the first input of the DC-DC converter, and a control terminal coupled to the second control signal.

16. The integrated circuit of claim 11, further comprising:

a third switch including a first terminal coupled to the first crystal pin, a second terminal, and a control terminal coupled to an operating mode signal;

a fourth switch including a first terminal coupled to a second crystal pin, a second terminal, and a control terminal coupled to the operating mode signal;

a start-up oscillator circuit including a first input terminal coupled to the second terminal of the third switch and a second input terminal coupled to the second terminal of the fourth switch.

17. The integrated circuit of claim 11, wherein:

when the operating mode signal indicates a start-up mode, the start-up oscillator circuit is used to provide a start-up clock signal;

when the operating mode signal indicates a normal active mode, the switched oscillator circuit is used to provide the clock signal.

18. A method of operating an oscillator circuit, the method comprising:

during a start-up period of operation:
operating a start-up oscillator circuit;
operating a first switch to provide a first voltage value from a DC-DC converter to a coupling capacitor in a switched oscillator circuit, wherein the first switch is pulsed closed periodically and then opened;

during a normal active period of operation:
discontinuing operation of the start-up oscillator;
continuing to operate the first switch to provide a second voltage value from the DC-DC converter to the coupling capacitor by pulsing the first switch closed periodically and then opening the first switch;
operating a second switch to provide a first supply voltage to the coupling capacitor, wherein the second switch is pulsed closed at different times than the first switch; and during the start-up and the normal active periods, providing output of the coupling capacitor to a sample and charge circuit.

19. The method of claim 18 further comprising:

charging a comparator capacitor with output from the sample and charge circuit and a voltage from a resonator;

providing output from the comparator capacitor to a low power comparator;

outputting a periodic signal from the comparator; and providing the periodic signal to a pulse generator to generate control signals to operate the first and second switches.

20. The method of claim 19, further comprising:

charging a second coupling capacitor with voltage from the resonator, wherein the second capacitor is coupled between the resonator and the first supply voltage.

* * * * *